United States Patent
El-Agha et al.

(10) Patent No.: US 7,816,979 B2
(45) Date of Patent: Oct. 19, 2010

(54) CONFIGURABLE DEMODULATOR AND DEMODULATION METHOD

(75) Inventors: Alaa El-Agha, Waterloo (CA); Dustin Griesdorf, Waterloo (CA); Gareth P. Weale, New Hamburg (CA); Jakob Nielson, Waterloo (CA)

(73) Assignee: ON Semiconductor Trading Ltd., Hamilton (BM)

( * ) Notice: Subject to any disclaimer, the term of this patent is extended or adjusted under 35 U.S.C. 154(b) by 102 days.

(21) Appl. No.: 12/028,292

(22) Filed: Feb. 8, 2008

(65) Prior Publication Data

US 2009/0096519 A1    Apr. 16, 2009

Related U.S. Application Data

(60) Provisional application No. 60/980,244, filed on Oct. 16, 2007.

(51) Int. Cl.
    *H04L 27/14* (2006.01)
(52) U.S. Cl. ............... 329/300; 329/303; 332/100; 332/101; 375/357; 375/371
(58) Field of Classification Search .......... 329/300, 329/303; 332/100, 101; 375/357, 371
    See application file for complete search history.

(56) References Cited

U.S. PATENT DOCUMENTS

| 4,574,247 | A | * | 3/1986 | Jacob | 329/300 |
| 6,914,478 | B2 | * | 7/2005 | Takasu et al. | 329/300 |
| 7,016,284 | B2 | * | 3/2006 | Chou | 369/53.34 |
| 7,026,864 | B2 | | 4/2006 | Shiung | |
| 2003/0123571 | A1 | * | 7/2003 | Scheffler | 375/316 |

* cited by examiner

*Primary Examiner*—Joseph Chang
*Assistant Examiner*—Richard Tan
(74) *Attorney, Agent, or Firm*—Pearne & Gordon LLP

(57) ABSTRACT

A method and system for a frequency shift key demodulation is provided. The system includes a counting block for counting a reference clock within a window defined by a modulated signal, a detector for comparing a count value output from the counting block with digital multi-level thresholds and outputting baseband data based on the comparison, and a configurations block for configuring at least one of the counting block and the detector. The method includes counting a reference clock within a window defined by the FSK modulated signal and outputting a count value as a result of the counting, and comparing the count value with multi-level thresholds to output baseband data based on the comparison.

24 Claims, 16 Drawing Sheets

CONFIGURABLE DEMODULATOR AND DEMODULATION METHOD

FIELD OF INVENTION

The present invention relates to a demodulator for communication systems, and more specifically to a method and system for programmable and configurable digital demodulation.

BACKGROUND OF THE INVENTION

Frequency Shift Keying (FSK) is one of the most frequently used digital modulation schemes. It finds widespread use in low to medium data rate applications. Demodulation is a process that takes place on the receive side of a communications link wherein the receiver recovers the baseband data bits from the received signal. The communications link can be wired or wireless link. In the receiver, the functional block that performs the demodulation process is called the demodulator. In an RF wireless receiver, an RF front-end processes the received signal to prepare it for demodulation before presenting it to the demodulator.

Digital FSK demodulators are attractive as they offer many advantages over their analog counterparts. Among these advantages are flexibility, possible early verification in a hardware setup, i.e., Field Programmable Gate Array (FPGA), scales up or down with technology with much less efforts than analog demodulators, easier integration with digital baseband processors, and their performance is much less affected by temperature, supply and process variations than the analog demodulators.

Digital FSK demodulators are widely used. Primarily they fall into one of two categories. One is based on using correlators, and the other one is based on using frequency discriminators. In binary FSK, a correlator demodulator uses two correlators, where one correlator performs a correlation function between an input signal ($S_{IF}$) and a locally generated waveform that represents bit "1" (which is at frequency $f_1$). The other correlator also correlates the signal $S_{IF}$ with a locally generated waveform that represents bit "0" (which is at frequency $f_0$). The correlation operation is performed over one data bit duration. The output of the two correlators is then compared and a decision is then made whether the bit is "1" or "0". In the frequency discriminator FSK demodulators, the frequency of the signal $S_{IF}$ is estimated by a discrimination circuit, which is simply a time-domain differentiator. Estimating what the signal $S_{IF}$ frequency is, determines whether the frequency is $f_1$ or $f_0$, and accordingly whether the data bit is "1" or "0".

Although conceptually simple, the above digital FSK demodulators have complex implementations. This is because computing either the correlation or the time-domain derivative requires processing power that is not available on ultra-low power devices. Even if such processing power is available, the power consumption is normally high.

Therefore, there is a need for an all-digital FSK demodulator that is simple and does not require high computational power.

U.S. Pat. No. 7,026,864 B2 (Shiung) discloses an all-digital FSK demodulator. It performs two major functions. First, by oversampling an input signal ($S_{IF}$), it detects the transitions and produces a "1" if a transition exists and a "0" if no transition is found. It then counts the number of ones and zeros. The number of ones is delivered to the Threshold Device which is then compared to the threshold level. Second, the Threshold Device uses a single threshold to determine whether the bit is "1" or "0". While not necessary, it preferably sets the threshold to $(f_1+f_0)/R$, where $f_1$ is the frequency that represents bit "1", $f_0$ is the frequency that represents bit "0" and R is the data date.

While simple, there are two issues with Shiung. First, using a single threshold for bit decision makes the decision process subject to instantaneous errors due to system noise. This becomes more sensitive in a wireless environment due to interference from other systems. If the noise or interference level is such that the number of ones count is offset by one, a bit error results. The other issue is related to the appropriateness of this scheme in cases where the FSK modulation uses intermediate frequency steps as the baseband data bit changes. No provision is set by Shiung to differentiate between transitions due to intermediate frequency steps. Shiung is suitable for demodulating FSK modulated signals wherein two distinct frequencies are used only, one representing bit "1" and the other representing bit "0".

Intermediate frequency steps in FSK modulation is of significant importance in wireless communications as it allows to spectrally shape the modulated FSK signal. Otherwise, the resulting FSK modulated signal may occupy a wider bandwidth, an issue known as spectral re-growth. In many cases, such bandwidth cannot be fit within the allocated RF spectrum (due to regulatory requirements), and either the data rate needs to be reduced or the signal be filtered by a bandpass filter at the RF carrier frequency. Neither of these options is desirable.

SUMMARY OF THE INVENTION

It is an object of the invention to provide a method and system that obviates or mitigates at least one of the disadvantages of existing systems.

According to an aspect of the present invention there is provided a demodulator, which includes a counting block for counting a reference clock within a window defined by a modulated signal, a detector for comparing a count value output from the counting block with digital multi-level thresholds and outputting baseband data based on the comparison, and a configurations block for configuring at least one of the counting block and the detector.

According to another aspect of the present invention there is provided a method of demodulating a modulated signal, which includes counting a reference clock within a window defined by the modulated signal and outputting a count value as a result of the counting, and comparing the count value with multi-level thresholds to output baseband data based on the comparison.

BRIEF DESCRIPTION OF THE DRAWINGS

These and other features of the invention will become more apparent from the following description in which reference is made to the appended drawings wherein.

DETAILED DESCRIPTION

Figure 1:
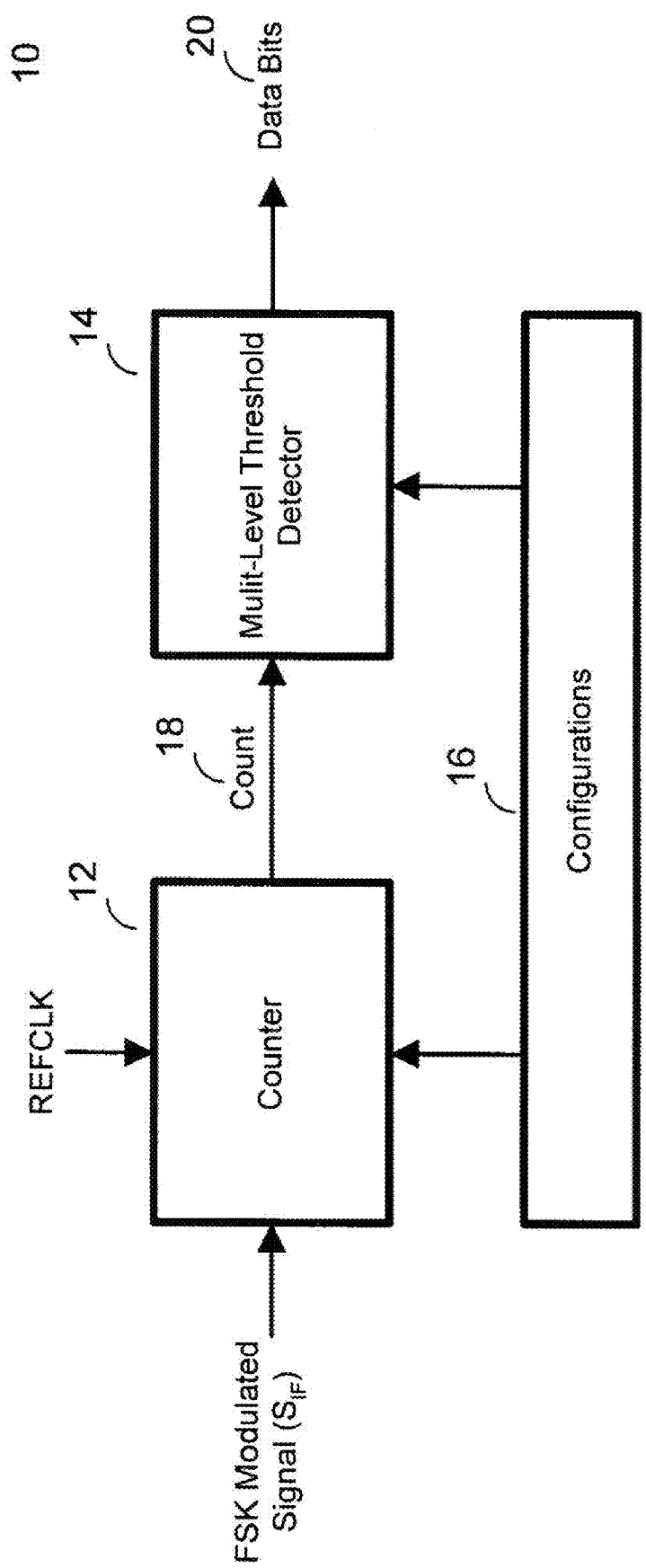
FIG. 1 is a diagram illustrating an example of an all-digital demodulator in accordance with an embodiment of the present invention.

FIG. 1 is a diagram illustrating an example of an all-digital demodulator in accordance with an embodiment of the present invention. The demodulator 10 of FIG. 1 is configurable and programmable for multi-modulation schemes. In FIG. 1, the modulator 10 is configured to act as an FSK demodulator (hereinafter referred to as FSK demodulator 10). The FSK demodulator 10 of FIG. 1 includes a counting block 12, a multi-level threshold detector 14, and a configurations block 16. The FSK demodulator 10 performs digital signal processing. The counting block 12 accepts at its input a FSK modulated signal $S_{IF}$, and a reference clock REFCLK, and outputs a count value 18 to the multi-level threshold detector 14. The FSK modulated signal $S_{IF}$ is formed by pulse-shaped signals. The multi-level threshold detector 14 acts upon the count value 18 based on a plurality of threshold levels, and outputs baseband data bits (Data bits) 20. The multi-level threshold detector 14 may have a digital comparator. The configurations block 16 holds configuration data to configure the functionality of the FSK demodulator 10. The FSK demodulator 10 may be configured as a demodulator for any other modulation schemes based on the configuration data. In the description, the terms "FSK signal", "FSK modulated signal" and "signal $S_{IF}$" may be used interchangeably.

The FSK demodulator 10 is in a receiver. The reference clock REFCLK is generated by the receiver and supplied to the FSK demodulator 10. It may be generated by a free-running oscillator or a Phase Locked Loop (PLL) that produces the desired frequency. The reference clock REFCLK may be synchronized to the signal $S_{IF}$ or may not be synchronized to the signal $S_{IF}$.

The REFCLK frequency is higher than the frequency (or frequencies) contained in the signal $S_{IF}$. If the signal $S_{IF}$ contains frequency components f0 and f1 (f1>f0) where a bit is represented by f0 and another bit is represented by f1, the REFCLK frequency is higher than f1. For example, the REFCLK frequency is set to be 10 times the highest frequency in the signal $S_{IF}$ (i.e., f1). In one implementation, f0 is 800 kHz, f1=1.1 MHz, and the REFCLK frequency is set to 50 MHz. How high the REFCLK frequency is to be set, compared to the highest frequency contained in the signal $S_{IF}$, is a design trade-off between power consumption (due to processing at higher clocks) and performance requirements such as jitter and Bit Error Rate (BER).

The counter block 12 includes at least one counter, and accepts at its inputs the FSK modulated signal $S_{IF}$ and the reference clock REFCLK. In the description, the terms "counting block" and "counter" may be used interchangeably.

Figure 2:
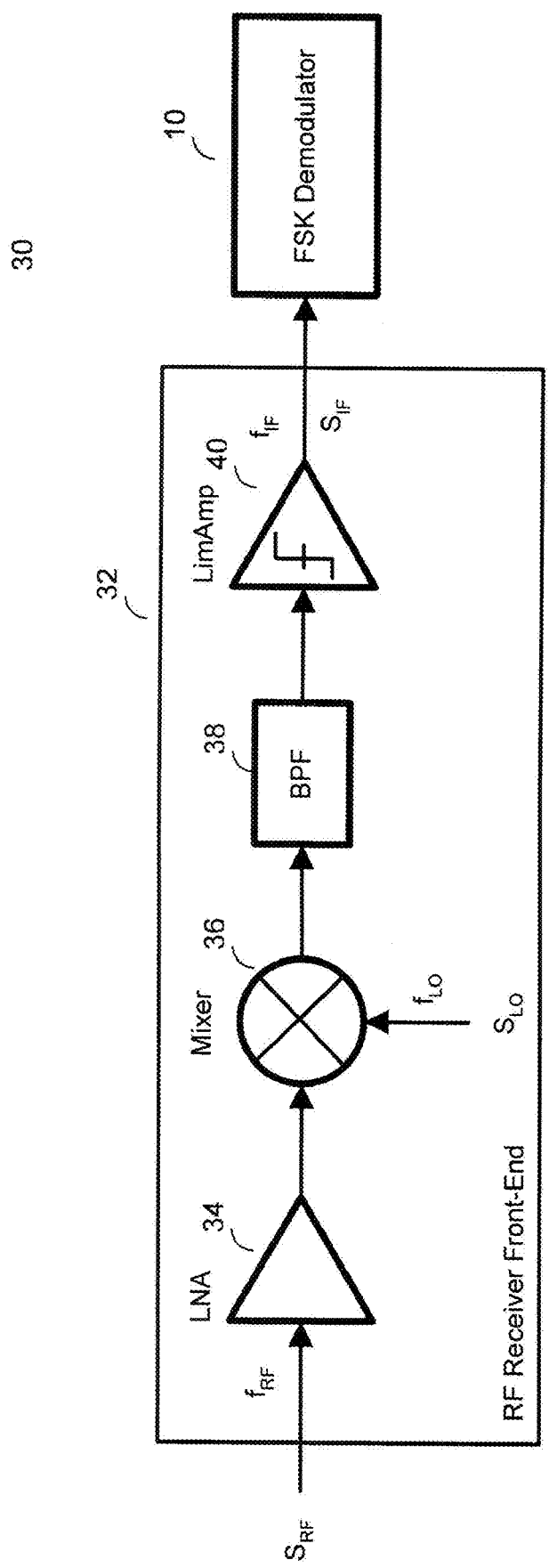
FIG. 2 is a diagram illustrating an example of RF receiver architecture having the FSK demodulator of FIG. 1.

FIG. 2 is a diagram illustrating an example of RF receiver architecture having the FSK demodulator 10 of FIG. 1. The RF receiver 30 includes an RF front-end block 32 and the FSK demodulator 10. The RF front-end block 32 processes its received signal $S_{RF}$ to prepare it for demodulation before presenting it to the FSK demodulator 10. The RF front-end block 32 includes a low noise amplifier (LNA) 34, a mixer 36, a bandpass filter (BPF) 38, and a limiting amplifier (LimAmp) 40. The received RF signal $S_{RF}$ having frequency $f_{RF}$ is mixed with a locally generated sinusoidal signal $S_{LO}$ having frequency $f_{LO}$. The output is then filtered by the BPF 38, amplified and limited by the LimAmp 40. The resulting $S_{IF}$ signal (referred to as FSK modulated signal) is a square wave version of the RF modulated signal $S_{RF}$ and has frequency $f_{IF}$. The FSK modulated signal $S_{IF}$ is passed to the FSK demodulator 10 for demodulation and recovering the baseband data bits (20 of FIG. 1).

It would be understood by one of ordinary skill in the art that the configuration of the receiver front-end 32 is not limited to that of FIG. 2 and may vary based on the receiver architecture used.

Figure 3:
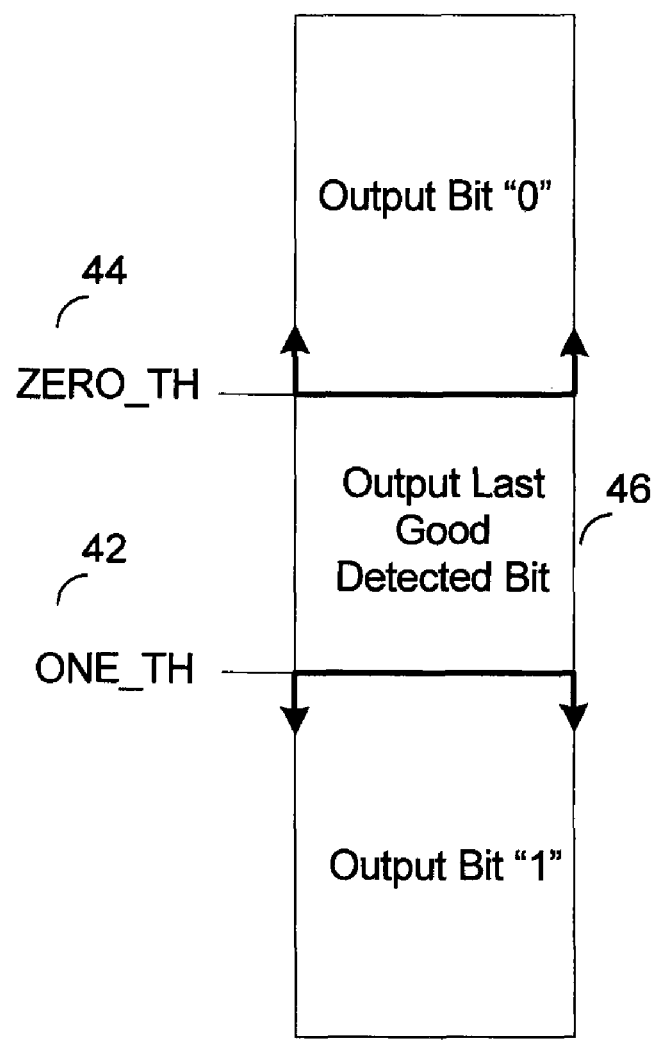
FIG. 3 is a diagram illustrating an example of a scheme employed by a multi-level threshold detector of FIG. 1, in accordance with an embodiment of the present invention.

FIG. 3 is a diagram illustrating an example of a scheme employed by the multi-level threshold detector 14 of FIG. 1, in accordance with an embodiment of the present invention. Referring to FIGS. 1 and 3, in this embodiment, the multi-level threshold detector 14 has two threshold levels. One threshold level is represented as ONE_TH 42, and the other is represented as ZERO_TH 44. Acting upon the count value 18 at its input, the multi-level threshold detector 14 compares the count value 18 to the two threshold levels 42 and 44 and determines what the baseband data bit 20 is.

If the count value 18 is below ONE_TH 42 (valid count value area), the multi-level threshold detector 14 outputs data bit "1", whereas if the count value 18 is above ZERO_TH 44 (valid count value area), it outputs data bit "0".

A region 46 between the two threshold levels 42 and 44 serves as an "uncertain" or bad bit detection area (invalid count value area). Whenever the count value 18 falls between the two threshold levels 42 and 44, the multi-level threshold detector 14 assumes that the count value 18 is erroneous and does not use it to make bit decision. In this case, the last good detected bit is used. The multi-threshold detector 14 outputs the last good detected data bit.

The last good detected data bit is the last bit that was detected based on its count value. In this example, the last good detected data bit is either "0" (the count value was higher than ZERO_TH 44), or "1" (the count value was lower than ONE_TH 42). When the detector 14 decides on a bit using the count value that is above ZERO_TH 44 or below ONE_TH 42, it designates this bit as the last good bit. If the subsequent count value is between ZERO_TH 44 and ONE_TH 42 (i.e., 46), that last good bit is output as the current detected bit.

The two threshold levels 42 and 44 are configurable. The two threshold levels 42 and 44 can be designed and set to values that will enhance the performance of bit detection by increasing or decreasing the uncertain detection area.

In FIG. 3, the two threshold levels ONE_TH 42 and ZERO_TH 44 are different. However, in another embodiment, the two threshold levels ONE_TH 42 and ZERO_TH 44 may be set to the same threshold level. In this case, no uncertain bit detection area (46 of FIG. 3) is used and the output data bit is always based on the current count value 18, where no previous data bits will be used.

In FIG. 3, the assignment of bit "1" to correspond to count value below ONE_TH 42, and bit "0" to count value above ZERO_TH 44 is based on the assumption that bit "1" is represented by the high frequency ($f_1$) in the FSK modulated signal, while bit "0" is represented by the low frequency ($f_0$) in the FSK modulated signal, i.e., $f_1 > f_0$. Such assignment can be changed or switched.

Figure 4:
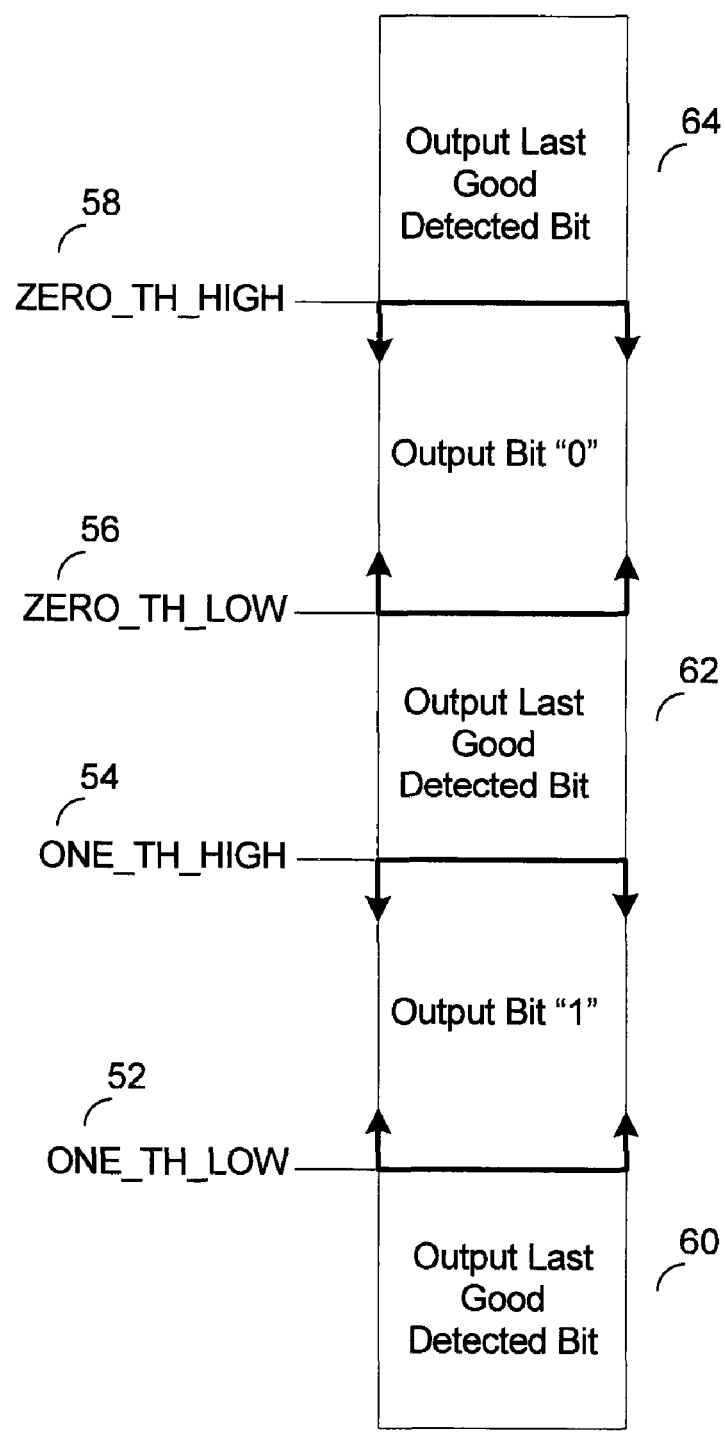
FIG. 4 is a diagram illustrating an example of a scheme employed by the multi-level threshold detector of FIG. 1, in accordance with another embodiment of the present invention.

FIG. 4 is a diagram illustrating an example of a scheme employed by the multi-level threshold detector 14 of FIG. 1, in accordance with another embodiment of the present invention. Referring to FIGS. 1 and 4, in this embodiment, the multi-level threshold detector 14 has two threshold levels assigned to each data bit type. The multi-level threshold detector 14 has two threshold levels assigned to bit "1", represented as ONE_TH_LOW 52 and ONE_TH_HIGH 54, and two threshold levels assigned to bit "0", represented as ZERO_TH_LOW 56 and ZERO_TH_HIGH 58.

If the count value 18 is between ONE_TH_LOW 52 and ONE_TH_HIGH 54 (valid count value area), the multi-level threshold detector 14 outputs bit "1". If the count value 18 is between ZERO_TH_LOW 56 and ZERO_TH_HIGH 58 (valid count value area), it outputs bit "0". Otherwise, the last good detected bit is output (60, 62, 64 of FIG. 4, invalid count value area).

Using two threshold levels per each data bit type adds more immunity to system noise and interference, hence allows the performance of the FSK demodulator 10 be tailored to the system and its environment.

Referring to FIG. 1, the threshold levels used by the multi-level threshold detector 14 are stored in the configurations block 16. The configurations block 16 includes a storage/repository for storing the threshold levels. The storage may be volatile or non-volatile, and is updatable. The associated threshold levels are loaded/provided to the multi-level threshold detector 14. The threshold levels may be loaded into the multi-level threshold detector 14 as part of the FSK demodulator initialization. The threshold levels may either be loaded at initialization and stay fixed, or changed dynamically while the FSK demodulator 10 is running so as to fine tune the demodulator performance "on the fly".

For example, the RF receiver (e.g., 30 of FIG. 2) may have a mechanism to detect the system noise or interference level. This information is then used by the RF receiver to adjust the threshold levels in the multi-level threshold detector 14 in a dynamic manner.

In one example, the mechanism for the detection of the system noise or interference level is implemented based on measuring the received signal strength and provides an indication of how strong the RF signal is (called Received Signal Strength Indicator, RSSI). If the signal strength is high, the uncertain region is made smaller or completely eliminated by setting ZERO_TH=ONE_TH (in FIG. 3). As the signal strength gets lower, the uncertain region can be widened. How high and low the signal strength has to be and by how much the uncertain region is widened or narrowed is design specific. The RSSI mechanism may be, but not limited to, be part of the RF receiver 30 of FIG. 2.

In another example, the mechanism for the detection of the system noise or interference level is implemented by estimating the BER and feeding this information back to the multi-level threshold detector 14 to widen or narrow the uncertain region. The BER mechanism may be, but not limited to, be an outside element, e.g., part of the baseband processing of the data bits produced by the multi-level threshold detector 14.

The counting and demodulation operation by the FSK demodulator 10 of FIG. 1 is described in detail. In one embodiment, the counting block 12 counts the number of REFCLK cycles that occur between two events. The actual count value between the two events is sent to the multi-level threshold detector 14 without any further processing. The time duration between these two events is represented as "Divide Unit". Each of these events is defined, for example, by pulses in the FSK modulated signal $S_{IF}$.

In one embodiment, two consecutive rising edges or two consecutive falling edges are used as the two events that define the "Divide Unit". This reduces the effect of duty cycle variations over time in the FSK modulated signal $S_{IF}$ that may be caused by, for example, the LimAmp 40 of FIG. 2.

In the description below, two rising edges are used for explanation purposes so that the duration between two rising edges defines one Divide Unit. The counting operation by the counting block 12 is controlled based on the Divide Unit.

The counting block 12 may include an event detector for detecting events associated with the Divide Unit to control the counting operation by the counting block 12. The Divide Unit may be stored in the configurations block 16 and be loaded/provided to the counting block 12.

Figure 5A:
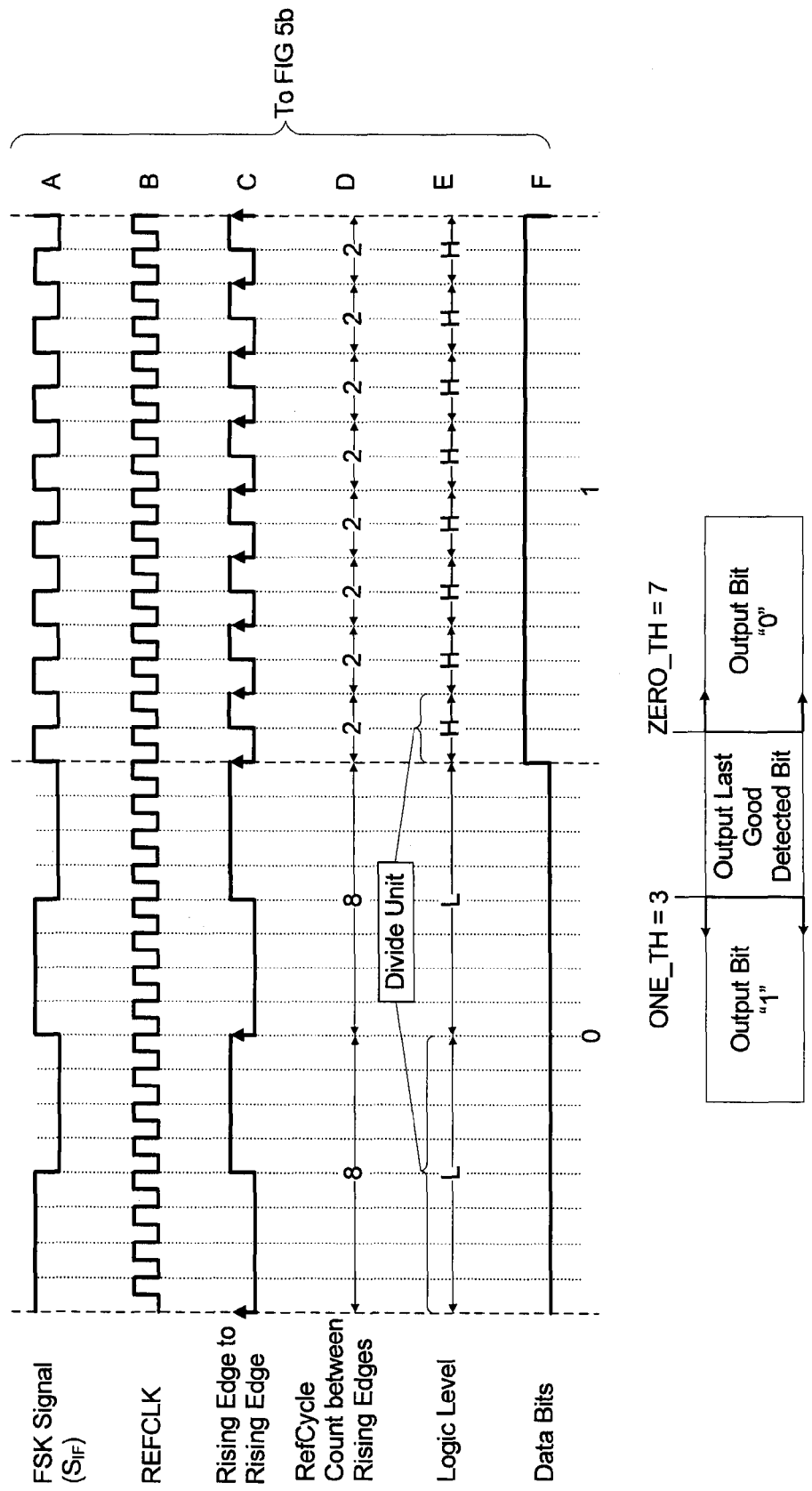
FIGS. 5a and 5b is a timing diagram illustrating an example of demodulation operation by the FSK demodulator of FIG. 1, in accordance with an embodiment of the present invention.
Figure 5B:
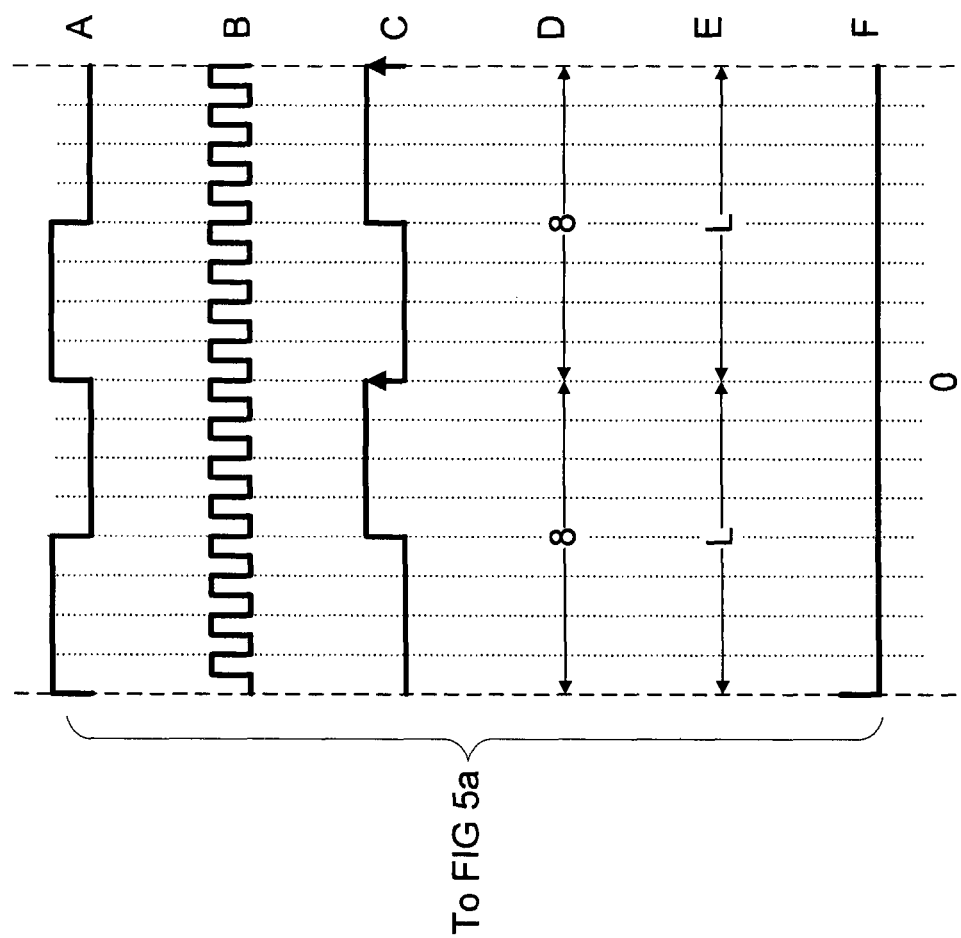
Figure 6:
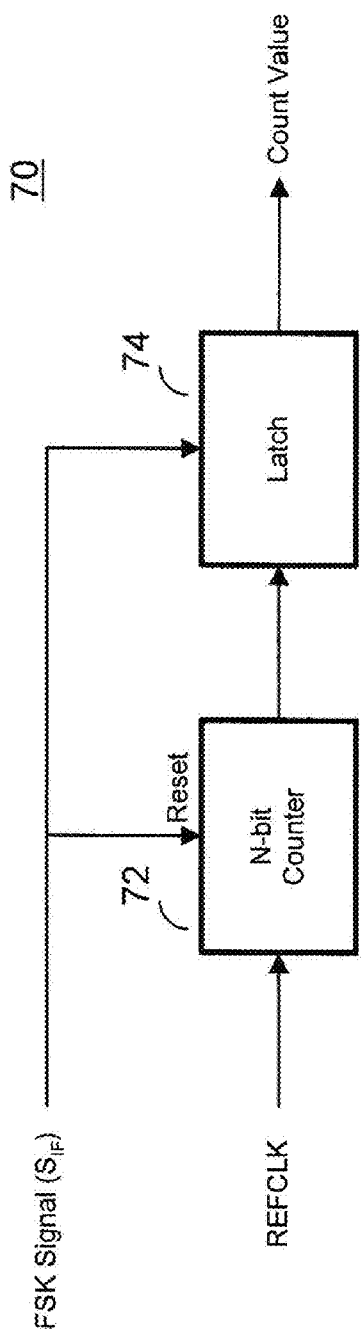
FIG. 6 is a block diagram illustrating an example of the counting block of FIG. 1, in accordance with an embodiment of the present invention.

FIGS. 5a and 5b is a timing diagram illustrating an example of demodulation operation by the FSK demodulator 10 of FIG. 1, in accordance with an embodiment of the present invention. In FIGS. 5a and 5b, data bit "1" is represented by a high frequency, while bit "0" is represented by a low frequency. In FIG. 6, ONE_TH=3 and ZERO_TH=7 (42, 44 of FIG. 3). The values of the threshold levels are examples only, and may vary. In FIGS. 5a and 5b, each Divide Unit is defined by the two rising edges of consecutive two pulses in the FSK signal SIF.

The FSK modulated signal $S_{IF}$ is shown in Trace A, and the REFCLK is shown in Trace B. Trace C shows the FSK modulated signal $S_{IF}$ with the rising edges marked indicating that the counting block (12 of FIG. 1) counts the number cycles in REFCLK, which occur between any two consecutive rising edges of the FSK modulated signal $S_{IF}$. This number is indicated in Trace D. Upon receiving the count value (18 of FIG. 1), the multi-level threshold detector (14 of FIG. 1) outputs bit "0" or bit "1" by keeping the logic level LOW (L) or HIGH (H) based on the threshold levels ONE_TH (=3) and ZERO_TH (=7). The output of the multi-level threshold detector is shown in Trace E which is the demodulated data bits.

In this implementation, the output of the multi-level threshold detector is an oversampled version of the demodulated data bits. However, the data bits are generated by keeping the same logic level or changing it as a new count value is input to the multi-level threshold detector for each Divide Unit.

FIG. 6 is a block diagram illustrating an example of the counting block of FIG. 1, in accordance with an embodiment of the present invention. The counting block 70 of FIG. 6 corresponds to the counting block 12 of FIG. 1, and is employing the operation of FIGS. 5a, 5b. The counting block 70 includes a counter 72 with N bits and having an edge-sensitive reset input, and a latch 74. The counter 72 is clocked by REFCLK and is reset on the rising edge of the FSK signal $S_{IF}$. On the first rising edge, the counter 72 is reset. The counter 72 then increments for every REFCLK cycle. On the following rising edge, the count value is latched 74, and the counter 72 is reset. The process then repeats. The number of bits (N) for the counter 72 is determined based on the frequency of REFCLK and the lowest frequency contained in the FSK signal $S_{IF}$. "N" is set to be large enough to prevent the counter from overflowing between two consecutive rising edges. For example, if REFCLK is 50 MHz, and the lowest frequency contained in the FSK signal $S_{IF}$ is 1 MHz (i.e., frequency that corresponding to bit "0"), the maximum count value that the counter 72 will count to is 50. In this case, a 6-bit count will suffice the counting operation.

Referring to FIG. 1, in another embodiment, the counting block 12 employs a Moving Average (MA). The number of Divide Units over which the MA function is performed is represented as "MALEN". The MALEN is stored in the configurations block 16 and is loaded/provided to the counting block 12. The MA function differs from averaging function AVG described below in the sense that a part of the counting result for one MALEN is used for the other MALEN. The counting block 12 starts by counting. When MALEN Divide Units have been used, the count value pertaining to the oldest Divide Unit is dropped from the MA computation and replaced with the new count value for the new Divide Unit. Thus, the MA function performs averaging over window which slides over time, a "sliding window". The MA function implements a low pass filter on the FSK modulated signal, where the MALEN controls the cutoff frequency of the low pass filter.

Figure 7A:
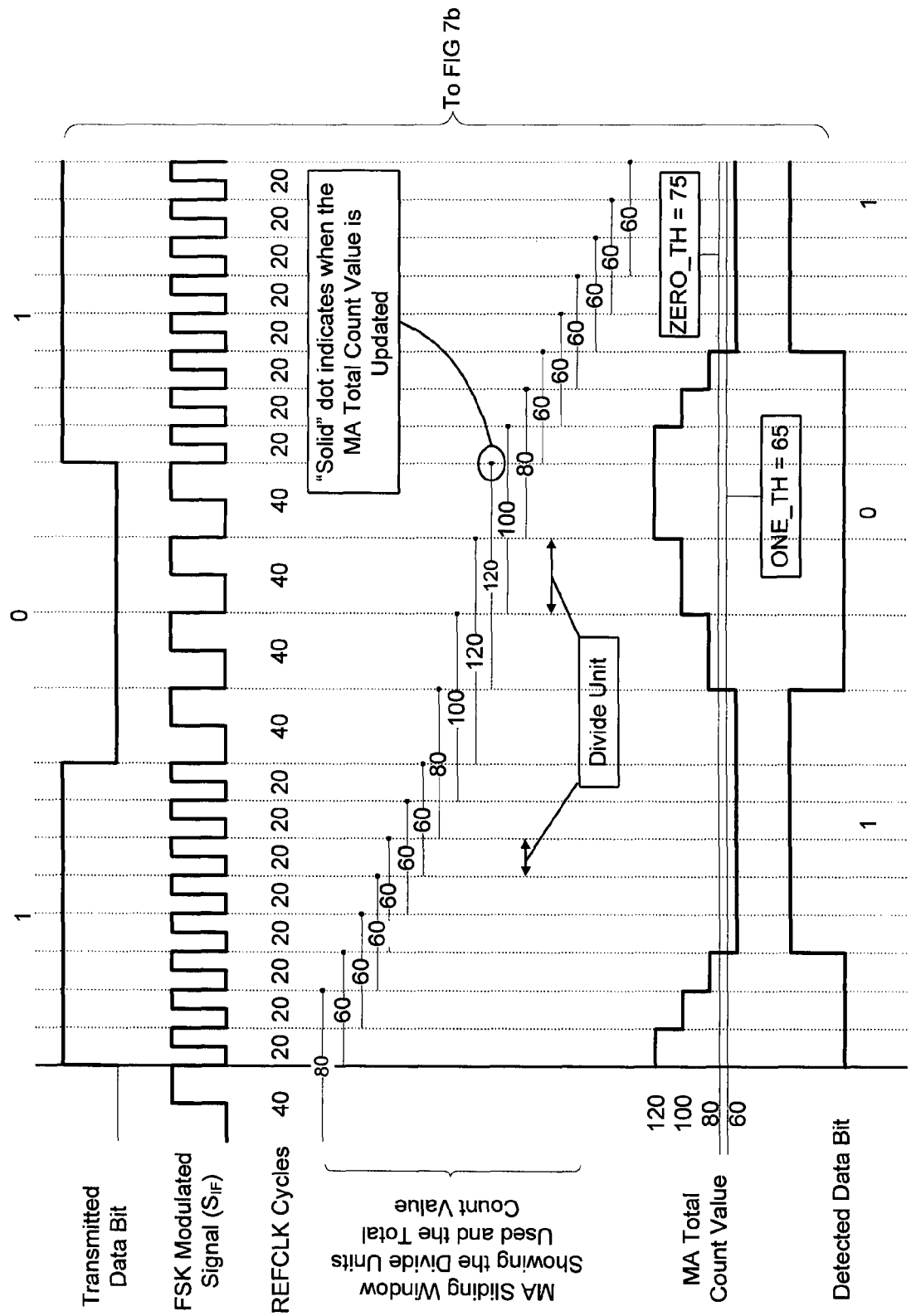
FIGS. 7a and 7b is a timing diagram illustrating an example of demodulation operation by the FSK demodulator of FIG. 1, in accordance with another embodiment of the present invention.
Figure 7B:
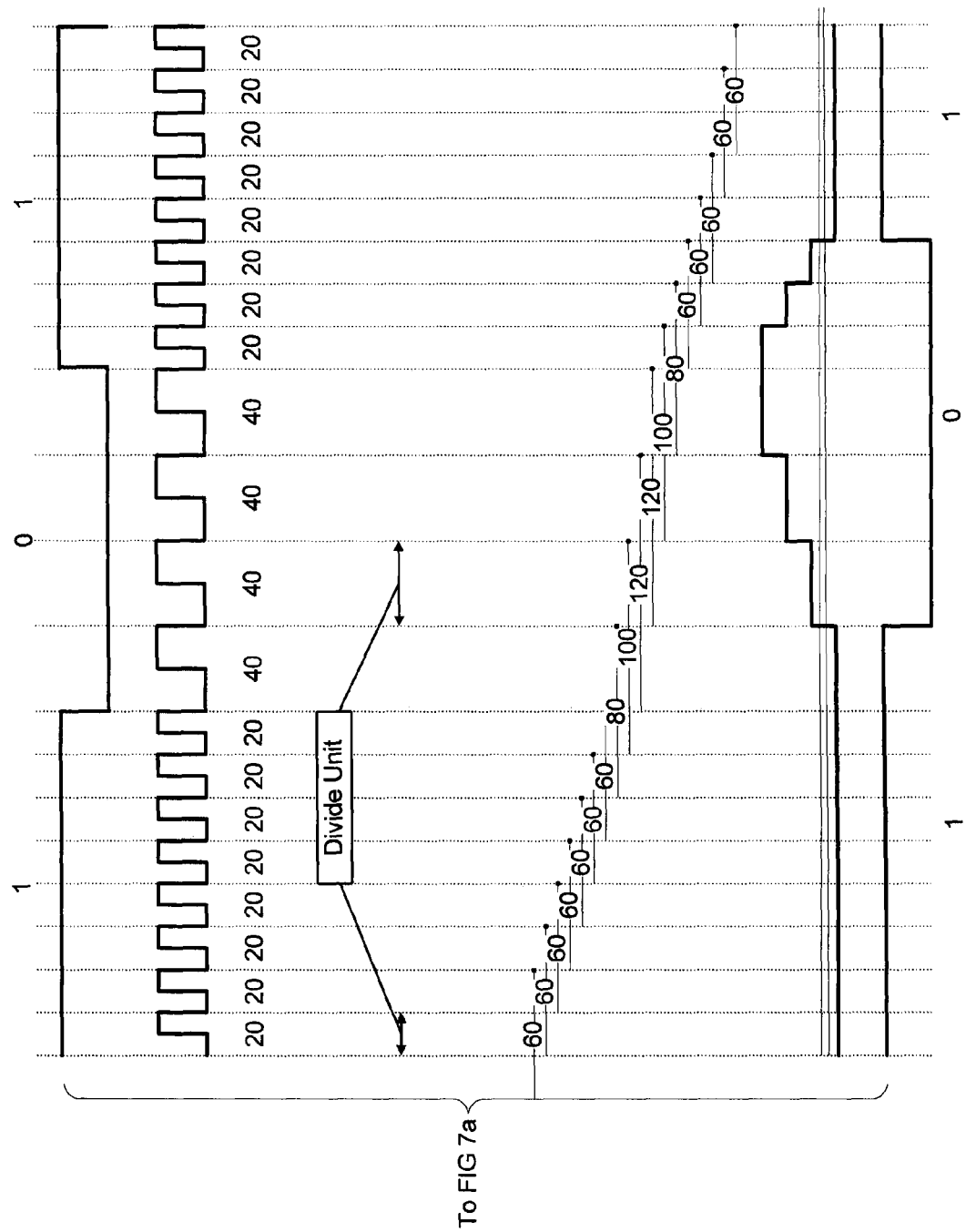

FIGS. 7a and 7b is a timing diagram illustrating an example of demodulation operation by the FSK demodulator 10 of FIG. 1, in accordance with another embodiment of the present invention. In FIGS. 7a and 7b, the counter block 12 of FIG. 1 implements the MA function. In FIGS. 7a and 7b, the FSK modulated signal SIF is produced by a high frequency clock divided by 20 for bit "1" and divided by 40 for bit "0". In FIGS. 7a and 7b, the MALEN is set to 3 where three Divide Units form the MALEN. It will be understood by one of ordinary skill in the art that the division of the frequency clock and the MALEN may vary depending upon the system design/requirements. In FIGS. 7a and 7b, no intermediate frequency steps are used. In FIGS. 7a and 7b, each solid dot mark indicates when the MA total count value is updated. In FIGS. 7a and 7b, the Divide Units are defined by the rising edges of two consecutive pulses in the FSK signal SIF.

The multi-level threshold detector (14 of FIG. 1) compares the result of the MA function with the two thresholds, ONE_TH and ZERO_TH (42, 44 of FIG. 3). In FIGS. 7a and 7b, the ONE_TH and ZERO_TH threshold levels are set to 65 and 75 respectively. It will be understood by one of ordinary skill in the art that the two threshold levels may be set to any values and do not have to be set at the center point. In this example, the threshold levels are set closer towards 60 rather than an ideal center point between 60 and 120, which is 100. This shows the flexibility of the multi-level threshold detector in conjunction with the MA function.

Figure 8:
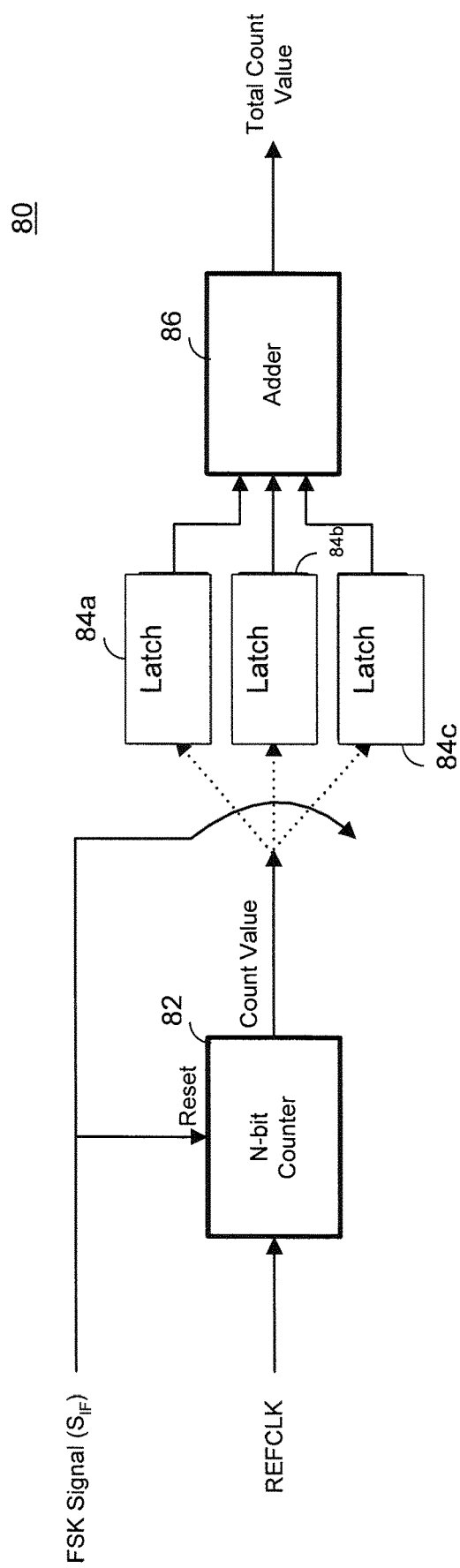
FIG. 8 is a block diagram illustrating an example of the counting block of FIG. 1, in accordance with another embodiment of the present invention.

FIG. 8 is a block diagram illustrating an example of the counting block of FIG. 1 in accordance with another embodiment of the present invention. The counting block 80 of FIG. 8 corresponds to the counting block 12 of FIG. 1 and is capable of employing the operation of FIGS. 7a, 7b. The counting block 80 includes an N-bit counter 82, an MALEN number of latches, and an adder 86. In FIG. 8, MALEN is set to 3, and three latches 84a, 84b and 84c are shown as an example of the MALEN number of latches. The N-bit counter 82 is clocked by REFCLK and is reset on the rising edge of the FSK signal $S_{IF}$. This is the same setup used in FIG. 6. The Moving Average function is implemented via the latches 84a, 84b and 84c which are configured as a cyclic buffer. On the first rising edge, the counter 82 is reset. It then increments per REFCLK cycle. On the next rising edge of the FSK signal $S_{IF}$, the count value is latched to the latch 84a and the counter 82 is reset. On the following two rising edges, the process repeats except that the count value is latched to the next latch (latch 84b, then latch 84c). On the next rising edge, the count value is latched to the latch 84a, and so on. Each time a new count value is latched to one of the latches 84a, 84b and 84c, the adder 86 computes the total count value. The configuration of the counting block 80 is one example for the operation of the MA function. It will be understand by one of ordinary skill in the art that any other configuration can be applicable to the counting block 12 of FIG. 1 for the MA function.

Referring to FIG. 1, in a further embodiment, the FSK modulated signal is produced by intermediate frequency steps as the data bits change in order to have smooth transition between the frequencies representing bit "0" and "1". This results in the FSK modulated signal occupying narrower bandwidth and reduces spectral re-growth.

Figure 9A:
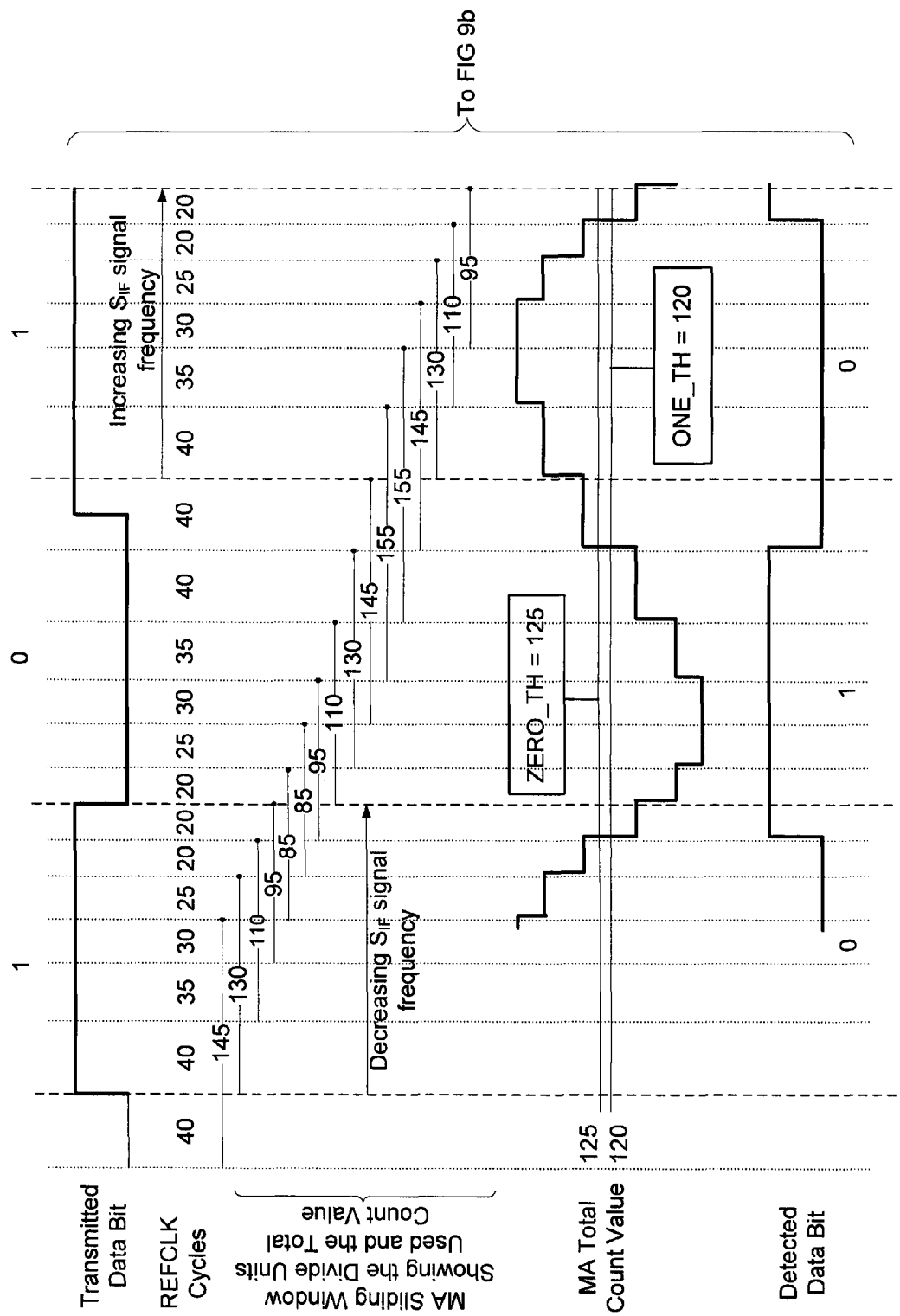
FIGS. 9a and 9b is a timing diagram illustrating an example of demodulation operation by the FSK demodulator of FIG. 1, in accordance with a further embodiment of the present invention.
Figure 9B:
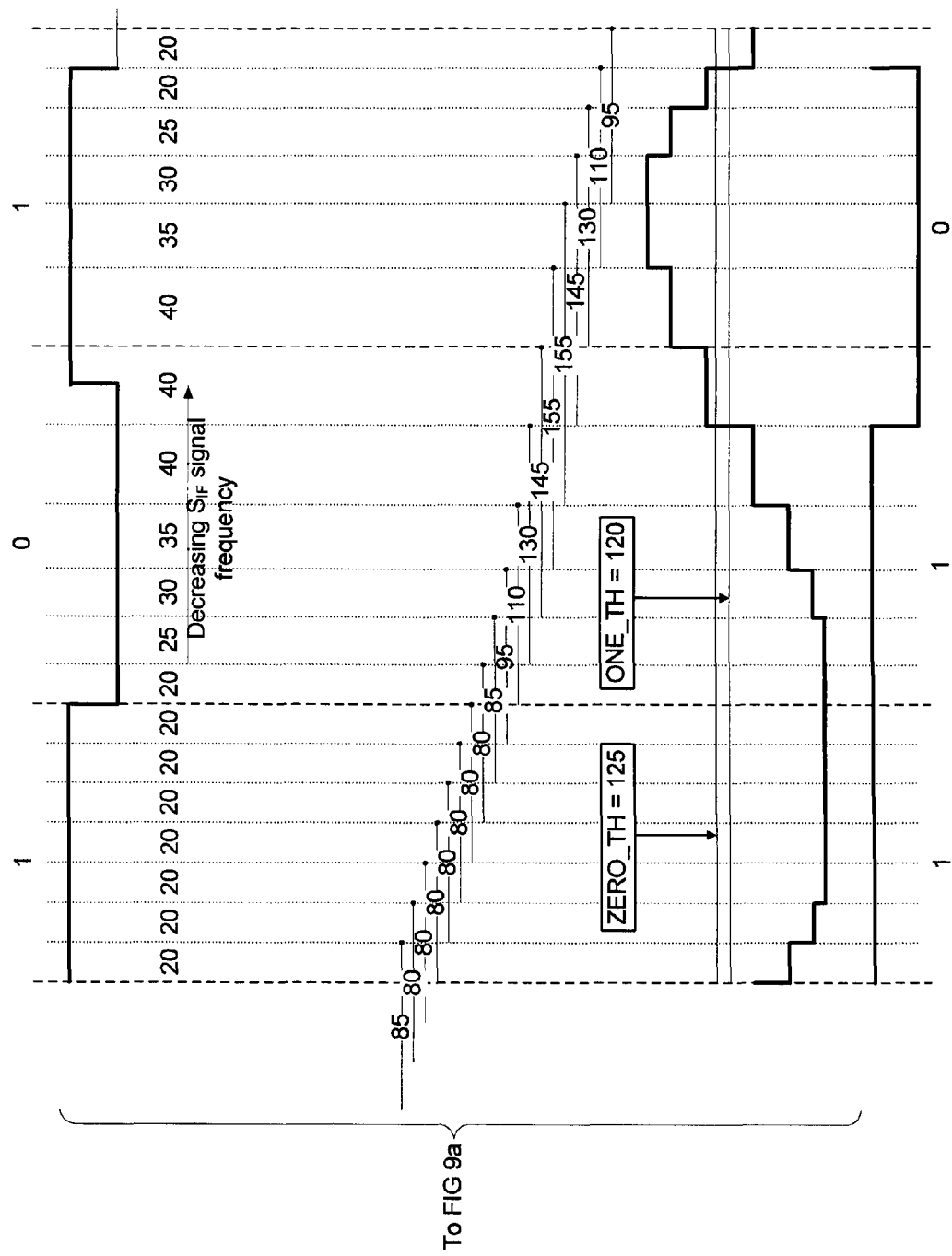

FIGS. 9a and 9b is a timing diagram illustrating an example of demodulation operation by the FSK demodulator 10 of FIG. 1, in accordance with a further embodiment of the present invention. In FIGS. 9a and 9b, the FSK demodulator demodulates the FSK modulated signal SIF having intermediate frequency steps, with the MA function. In FIGS. 9a and 9b, the MALEN is set to 4 where four Divide Units form the MALEN. It will be understood by one of ordinary skill in the art that the MALEN may vary depending on the system design/requirement. In FIGS. 9a and 9b, the Divide Units are defined by the rising edges of two pulses in the FSK signal SIF.

FIGS. 9a and 9b, the internal frequency steps are indicated by showing the REFCLK cycles. Over one bit duration; the number of REFCLK cycles is either increased or decreased depending on the data bit. The REFCLK is a clock running at fixed frequency. Thus increasing the REFCLK cycle number means the FSK modulated signal frequency is decreased, while decreasing the REFCLK cycle number results in the FSK modulated signal being increased. For example, it is assumed that the REFCLK has a frequency of 50 MHz. If the signal $S_{IF}$ is at 1 MHz, the REFCLK cycle number is 50, while if the signal $S_{IF}$ is at 2 MHz, then the REFCLK cycle number is 25. The ONE_TH and ZERO_TH thresholds (42, 44 of FIG. 3) are arbitrarily set to 120 and 125 respectively. Except for a slight delay, the FSK demodulator demodulates and recovers the data bit using the multi-level thresholds and MA function as shown in FIGS. 9a and 9b.

In one example, the counting block 80 of FIG. 8 is usable to employ the counting operation of FIGS. 9a and 9b. In this example, the counting block 80 has four latches, rather than latches 84a, 84b and 84c of FIG. 8 as the MALEN is set to 4.

Referring to FIG. 1, in a further embodiment, the counting block 12 implements an Averaging (AVG) function. The number of Divide Units over which the AVG is performed is represented as "AVGLEN". The AVGLEN is stored in the configurations block 16 and is loaded/provided to the counting block 12. In this embodiment, the counting operation by the counting block 12 does not reset until AVGLEN Divide Units have elapsed. For example, if the AVGLEN is eight, and the triggering event is two consecutive rising edges of the pulses of the signal SIF, then on the first rising edge the counter starts counting. The counter continues counting and will reset when the AVGLEN Divide Units have elapsed. Accordingly, the threshold levels in the multi-level threshold detector 14 are adjusted to account for the fact that the count value is now eight times the threshold value when no averaging is performed. The AVG function allows the FSK demodulator 10 to average out the effect of system noise and interference over a time period defined by the AVG length. This results in improved noise performance. For example, the operation of FIGS. 5a, 5b uses AVGLEN=1.

Figure 10:
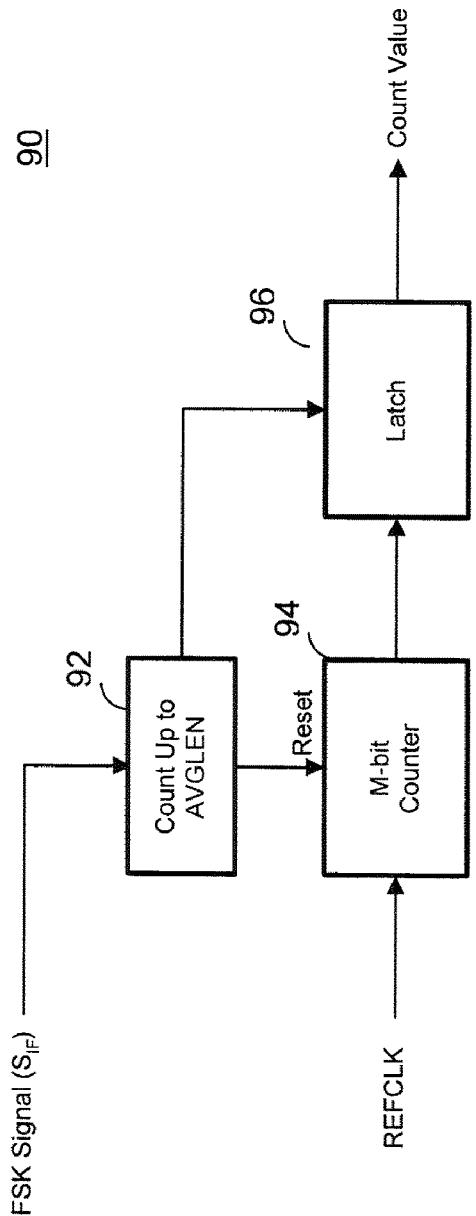
FIG. 10 is a block diagram illustrating an example of the counting block of FIG. 1, in accordance with a further embodiment of the present invention.

FIG. 10 is a block diagram illustrating an example of the counting block of FIG. 1 in accordance with a further embodiment of the present invention. The counting block 90 of FIG. 10 corresponds to the counting block 12 of FIG. 1 and is capable of employing the AVG function. The counting block 90 includes an intermediate counter 92, a M-bit counter 94 and a latch 96. The intermediate counter 92 counts up to AVGLEN. The counting block 90 is similar to the counting block 80 of FIG. 8, except the rising edges of the FSK signal $S_{IF}$ clock the intermediate counter 92. When this counter 92 overflows (indicating that AVGLEN period has elapsed), it causes the M-bit counter 94 to latch its count value, and reset. The count value is only updated once every AGVLEN period. The number of bits required for the M-bit counter 94 is to be large enough to prevent if from overflowing within the AVGLEN period.

Using the AVG function or the MA function enhances the detection process and provides better immunity against noise and interference, associated with an application (e.g., wireless communication).

In hardware implementations, when performing both AVG and MA functions, no division is required. From a mathematical point of view, the true AVG or MA value is only produced when dividing the total count (sum of count values for all AVGLEN or MALEN Divide Units) by either AVGLEN or MALEN. Although could be done, it is not required. The total count is proportional to the true AVG or MA, and hence it can be used directly by the multi-level threshold detector 14 of FIG. 1. This consumes less power since no division is performed.

Referring to FIG. 1, in a further embodiment, the FSK demodulator 10 implements Minimum Width function, called MinWidth. The MinWidth function rejects invalid pulses in the FSK modulated signal $S_{IF}$, which enhances immunity against noise and interference. The MinWidth function is for example, but not limited to, applied to at least one bit or symbol (e.g., "0", "1", "00", "01", "10", "11").

The MinWidth represents the minimum number of REFCLK cycles that is considered representative of a valid pulse in the FSK modulated signal $S_{IF}$. The counting block 12 counts the number REFCLK cycles within any Divide Unit. If a consecutive rising edge on the FSK signal $S_{IF}$ is found before the MinWidth value, this transition is rejected. The rejection is achieved by ignoring the new rising edge on the FSK signal $S_{IF}$. If a new rising edge is encounted by the counting block 12 while the count value is less than the MinWidth, this rising edge is considered as invalid (i.e., caused by noise or interferer) and is ignored by the counting block 12. In this case, the counting clock 12 continues to count until the next (valid) rising edge.

Figure 11:
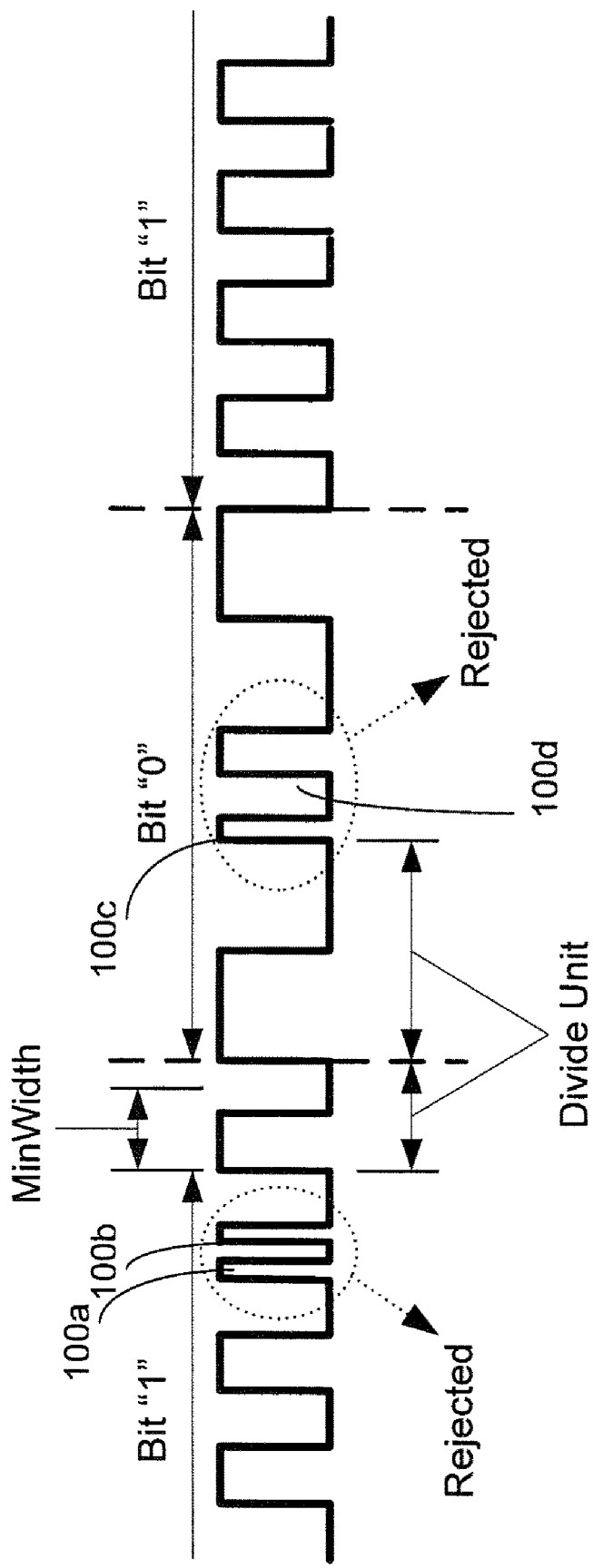
FIG. 11 is a timing diagram illustrating an example of MinWidth function operation employed by the multi-level threshold detector of FIG. 1, in accordance with an embodiment of the present invention.

FIG. 11 is a timing diagram illustrating an example of MinWidth function employed by the counting block 12 of FIG. 1 in accordance with an embodiment of the present invention. In FIG. 14, MinWidth for bit 1 is shown. In FIG. 11, pulses 100a-100d in the FSK modulated signal are rejected.

Figure 12:
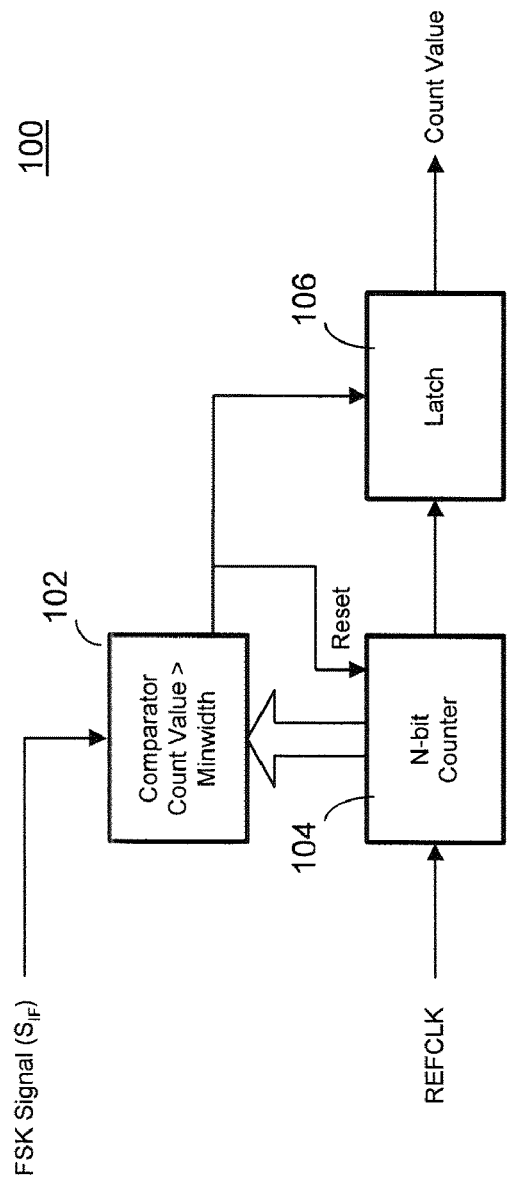
FIG. 12 is a block diagram illustrating an example of the counting block of FIG. 1, in accordance with a further embodiment of the present invention.

FIG. 12 is a block diagram illustrating an example of the counting block of FIG. 1, in accordance with a further embodiment of the present invention. The counting block 100 of FIG. 12 corresponds to the counting block 12 of FIG. 1 and is capable of employing the MinWidth function of FIG. 11. The counting block 100 includes a comparator 102, a N-bit counter 104 and a latch 106. The counting block 100 is similar to the counting block 80 of FIG. 8, except that it has the comparator element 102. Every time a rising edge on the FSK signal $S_{IF}$ occurs, before using this rising edge to reset the counter 104, the comparator 102 is used to compare the current count value of the N-bit counter 104 to MinWidth. If the current count value is greater than the MinWidth, then the reset signal is generated, the count value is latched 106 and the counter 104 is reset. Otherwise, the rising edge is ignored, and the counter 104 continues counting.

Figure 13:
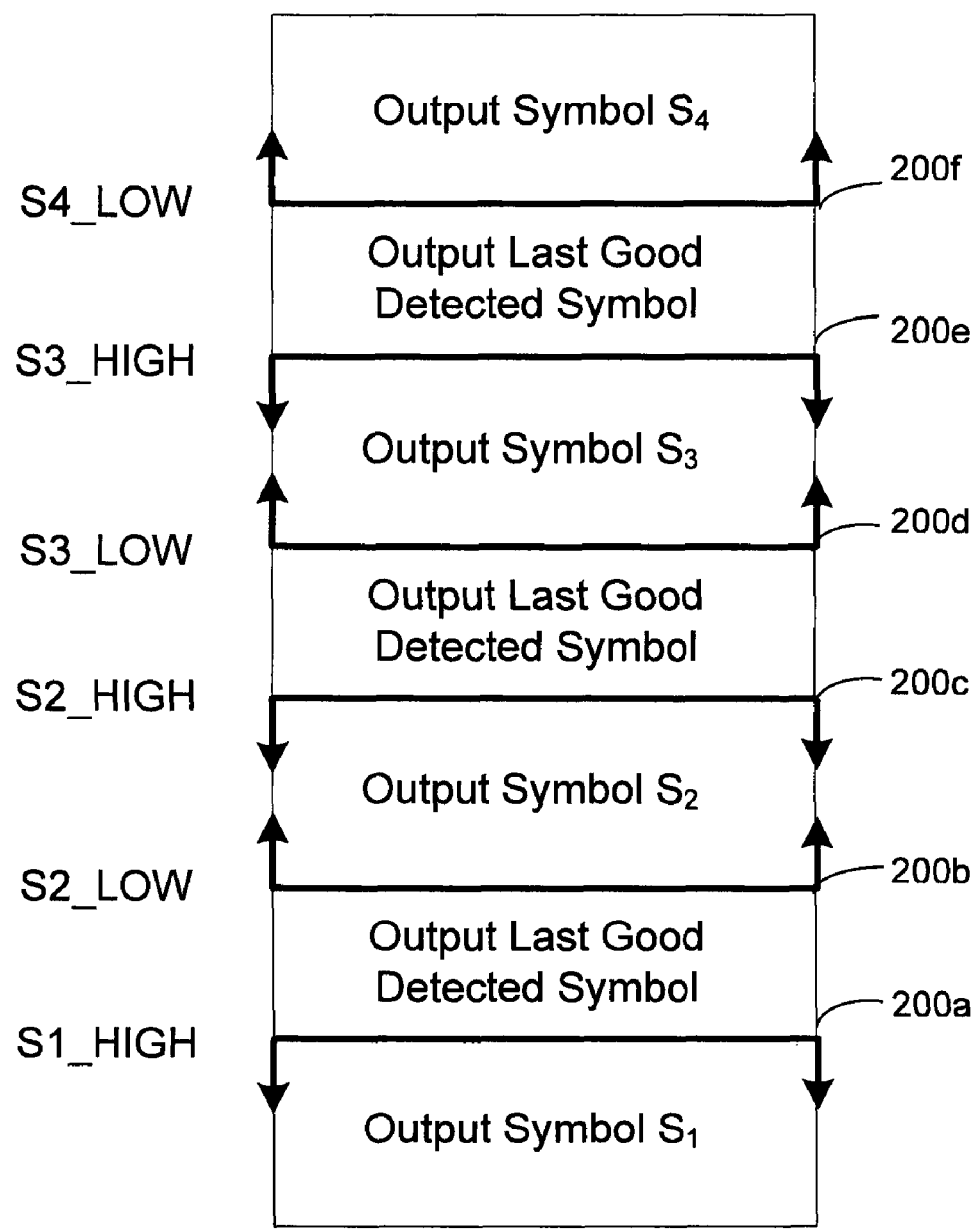
FIG. 13 is a diagram illustrating an example of a scheme employed by the multi-level threshold detector of FIG. 1, in accordance with a further embodiment of the present invention.

In a further embodiment, the FSK demodulator 10 of FIG. 1 is programmed/configured to act as a M-ary FSK demodulator. The FSK modulated signals $S_{IF}$ are produced by M carriers, rather than two. In this embodiment, the multilevel threshold detector 14 uses additional threshold levels. For example, to demodulate a 4-FSK modulated signal, two threshold levels may be defined between four symbols. FIG. 13 is a diagram illustrating an example of a scheme employed by the multi-level threshold detector 14 of FIG. 1, in accordance with a further embodiment of the present invention. In FIG. 13, six threshold levels 200a-200f are used to detect a 4-FSK modulated signal. There are four symbols $S_1$, $S_2$, $S_3$, and $S_4$, each of which defines two data bits (e.g., "00", "01", "10", "11"). For example, if the count value (18 of FIG. 1) is less than the threshold level 200a, it outputs the symbol $S_1$. If the count value is greater than the threshold level 200f, it outputs the symbol $S_4$. If the count value is between 200c and 200d, it outputs the last good detected symbol $S_1$, $S_2$, $S_3$, or $S_4$.

For demodulating the M-ary FSK modulated signals, a set of comparators are used to compare the count value to the threshold values for the symbols (FIG. 13), and output the corresponding symbol based on the comparison result.

The embodiments of the present invention are described using binary and M-ary FSK demodulators. However, it will be understood by one of ordinary skill in the art that the demodulation method and systems in the above embodiments are applicable to any other modulation schemes, e.g., digital modulation schemes including, but not limited to, Differential FSK and Minimum-shift keying (MSK).

According to the above embodiments, the demodulator utilizes all digital design, which allows easier integration, early verification of the design in hardware prior to tape out. The parameters for the operation are configurable, which allows fine tuning its performance to fit various applications. The demodulator are configurable and programmable for multi-modulation schemes. Further, the design of the demodulator enhances immunity against noise and interference, especially in wireless applications. The demodulation method and systems in accordance with the above embodiments provide a threshold detection and bit decision scheme to improve performance under noisy or interference conditions, suitable for demodulating a modulated signal with or without any number of intermediate frequency steps. The demodulation method and systems provide improved immunity to noise by using multi-thresholds detection, averaging and moving functions, pulse minimum width function that rejects invalid pulses in the modulated signal, or combinations thereof. The demodulation method and systems provide appropriateness to demodulate a modulated signal, such as a binary FSK, M-ary FSK, MSK modulated signal, which has intermediate frequencies between frequencies that represent data bits or symbols.

One or more currently preferred embodiments have been described by way of example. It will be apparent to persons skilled in the art that a number of variations and modifications can be made without departing from the scope of the invention as defined in the claims.

What is claimed is:

1. A demodulator, comprising:
   a counting block for counting a reference clock within a window defined by a received signal, including:
   a comparator for comparing a count value output from the counting block with a minimum width value to determine if the window is valid;
   a detector for comparing the count value for the valid window with digital multi-level thresholds and outputting baseband data based on the comparison; and
   a configurations block for configuring at least one of the counting block and the detector.

2. A demodulator as claimed in claim 1, wherein the window is defined by consecutive rising or falling edges in the received signal.

3. A demodulator as claimed in claim 1, wherein the window comprises one or more divide units, each divide unit being defined by consecutive rising or falling edges in a FSK modulated signal.

4. A demodulator as claimed in claim 3, wherein the window comprises the divide units, and wherein the counting block implements averaging the count value over the window.

5. A demodulator as claimed in claim 4, wherein the window is slidable, and wherein the counting block implements averaging the count value over the slidable window.

6. A demodulator as claimed in claim 1, wherein at least one of the window and the multi-level thresholds are loaded from the configurations block.

7. A demodulator as claimed in claim 1, wherein the multi-level thresholds comprise at least one first threshold for detecting a first bit or symbol and at least one second threshold for detecting a second bit or symbol.

8. A demodulator as claimed in claim 7, wherein the multi-level thresholds define at least one invalid count value area and at least one valid count value area, and wherein the detector outputs the last bit or symbol detected based on the at least one valid count value area when the count value falls into the at least one invalid count value area.

9. A demodulator as claimed in claim 1, wherein the received signal is a signal modulated by digital modulation scheme.

10. A demodulator as claimed in claim 9, wherein the digital modulation scheme comprises at least one of Frequency Shift Keying (FSK), Differential FSK, M-ary FSK, and MSK.

11. A demodulator as claimed in claim 1, wherein when the window is invalid the counting block rejects an invalid pulse which is received as a part of the received signal and forms the invalid window, and detects a valid next pulse in the received signal based on the minimum width value to form the valid window.

12. A method of demodulating a modulated signal, comprising:
    counting a reference clock within a window defined by a received signal and outputting a count value as a result of the counting, the step of counting including:
    comparing the window with a minimum width value to detect if the window is valid;
    rejecting an invalid pulse in the received signal, which forms the invalid window, and
    detecting a valid next pulse in the received signal to form the valid window; and
    comparing the count value for the valid window with multi-level thresholds to output baseband data based on the comparison.

13. A method as claimed in claim 12, further comprising:
    loading at least of the window and the multi-level thresholds.

14. A method as claimed in claim 12, further comprising:
    configuring at least of the window and the multi-level thresholds.

15. A method as claimed in claim 14, wherein the window comprises the divide units, and wherein the step of counting comprises averaging the count value over the window.

16. A method as claimed in claim 15, wherein the step of averaging comprises replacing a count value within an old divide unit with a new count value within a new divide unit.

17. A method as claimed in claim 12, wherein the step of counting comprises:
    counting the reference clock in the window defined by consecutive rising or falling edges in the received signal.

18. A method as claimed in claim 12, wherein the step of counting comprises:
    counting the reference clock in the window having one or more divide units, each divide unit being defined by consecutive rising or falling edges in the received signal.

19. A method as claimed in claim 12, wherein the multi-level thresholds comprise at least one first threshold for a first bit or symbol and at least one second threshold for a second bit or symbol, and wherein the step of comparing the count value for the valid window comprises comparing the count value with the at least one first threshold to detect the first bit or symbol and comparing the count value with the at least one second threshold to detect the second bit or symbol.

20. A method as darned in claim 19, wherein the multi-level thresholds define at least one invalid count value area and at least one valid count value area, and wherein the step of comparing the count value for the valid window comprises outputting the last bit or symbol detected based on the at least one valid count value area when the count value falls into the at least one invalid count value area.

21. A demodulator, comprising:
    a counting block for counting a reference clock within a window defined by a received signal;
    a detector for comparing a count value output from the counting block with digital multi-level thresholds and outputting baseband data based on the comparison, the multi-level thresholds defining at least two valid count value areas and at least one invalid count value area formed between the at least two valid count value areas, the detector outputting a last bit or symbol that has been detected in one of the at least two valid count value areas when the count value falls into the at least one invalid count value area; and
    a configurations block for configuring at least one of the counting block and the detector.

22. A demodulator as claimed in claim 21, wherein the multi-level thresholds comprise at least one first threshold for detecting a first bit or symbol and at least one second threshold for detecting a second bit or symbol, the at least one invalid count value area being formed between the first threshold and the second threshold.

23. A method of demodulating a modulated signal, comprising:
- counting a reference clock within a window defined by a received signal and outputting a count value as a result of the counting;
- comparing the count value with multi-level thresholds to output baseband data based on the comparison, the multi-level thresholds defining at least two valid count value areas and at least one invalid count value area formed between at least two valid count value areas; and
- outputting baseband data based on the comparison, including outputting a last bit or symbol that has been detected in one of the at least two valid count value areas when the count value falls into the at least one invalid count value area.

24. A method as claimed in claim 23, wherein the multi-level thresholds comprise at least one first threshold for a first bit or symbol and at least one second threshold for a second bit or symbol, the at least one invalid count value area being formed between the first threshold and the second threshold, and wherein the step of comparing comprises:
- comparing the count value with the at least one first threshold and the at least one second threshold to detect the first bit or the second bit or symbol, or output the last bit or symbol.

* * * * *